United States Patent [19]
van Bavel et al.

[11] Patent Number: 4,843,390
[45] Date of Patent: Jun. 27, 1989

[54] OVERSAMPLED A/D CONVERTER HAVING DIGITAL ERROR CORRECTION

[75] Inventors: Nicholas R. van Bavel; Tim A. Williams, both of Austin, Tex.

[73] Assignee: Motorola, Inc., Schaumburg, Ill.

[21] Appl. No.: 159,858

[22] Filed: Feb. 24, 1988

[51] Int. Cl.⁴ ............................................ H03M 1/18
[52] U.S. Cl. .................................. 341/139; 341/118; 341/120; 341/161
[58] Field of Search ............... 341/118, 120, 121, 123, 341/127, 139, 141, 143, 156, 161

[56] References Cited

U.S. PATENT DOCUMENTS

| | | | |
|---|---|---|---|
| 4,071,842 | 1/1978 | Tewksbury | 341/143 |
| 4,584,558 | 4/1986 | Maschek et al. | 341/139 |
| 4,704,600 | 11/1987 | Uchimura et al. | 341/122 |

OTHER PUBLICATIONS

Lawrence Rabiner and Bernard Gold, "Theory and Application of Digital Signal Processing", 1975, Chapters 6 and 10.

*Primary Examiner*—William M. Shoop, Jr.
*Assistant Examiner*—G. Romano
*Attorney, Agent, or Firm*—Robert L. King

[57] ABSTRACT

An oversampled A/D converter which utilizes digital error correction is provided. In one form, the present invention is used with a sigma delta modulator having a plurality of rank ordered quantization loops, Each quantization loop contains an analog integrator circuit of predetermined gain which is subject to variation, thereby introducing errors. When the product of a reciprocal of the analog integrator gain and the gain of a digital gain stage of a subsequent quantization loop equals one, minimum noise exists in the data conversion. A digital gain control circuit is coupled to the digital gain stage for adjusting the gain of the digital gain stage during a calibration mode to provide minimum noise in the converter, thereby compensating for errors attributable to the analog integrator circuit.

7 Claims, 3 Drawing Sheets

OVERSAMPLED A/D CONVERTER HAVING DIGITAL ERROR CORRECTION

CROSS REFERENCE TO RELATED APPLICATION

Application Ser. No. 07/147,958, entitled "A MULTIPLE OUTPUT OVERSAMPLING A/D CONVERTER WITH EACH OUTPUT CONTAINING DATA AND NOISE", filed Jan. 25, 1988 by Nicholas VanBavel and Tim A. Williams.

TECHNICAL FIELD

This invention relates generally to the field of data conversion systems, and, more particularly, to oversampling data converters for performing A/D conversion.

BACKGROUND ART

Oversampled A/D converters have been implemented to provide high resolution data conversion for many applications including video and audio applications. Typically, errors in the conversion process are introduced from sources such as noise and component parameter variations resulting from process and temperature variations. Component parameter errors are most noticeable in the analog circuitry portion of a data converter. Accordingly, others have previously used circuitry and other techniques to try to compensate for or correct errors associated with analog circuit errors which adversely affect accuracy during data conversion. For example, others have used lasers to trim resistors to an optimum value. Capacitive D/A converter structures are typically implemented with parasitic capacitive insensitive structures. Resolutions obtainable with some oversampling A/D converters reduce the need to perform error correction However, when error correction is implemented in data converters, correction techniques utilizing analog circuitry in the analog circuit portion are commonly implemented.

BRIEF DESCRIPTION OF THE INVENTION

Accordingly, an object of the present invention is to provide an improved oversampled A/D converter having digital error correction.

Another object of the present invention is to provide an improved digital error correcting data converter.

Yet another object of this invention is to provide an improved method for performing error correction in an oversampled data converter.

Yet a further object of the present invention is to provide an improved method of error correction in an oversampled A/D data converter.

In carrying out the above and other objects of the present invention, there is provided, in one form, an oversampled A/D converter having digital error correction for converting an analog input signal to a digital output signal. In one form, the converter has first and second quantization loops. Additional quantization loops may be utilized. Each quantization loop comprises an integrator and a quantizer. Each integrator has a predetermined gain wherein the integrator of the first loop has a first predetermined gain. Each integrator integrates a difference between an input terminal signal and a feedback signal. A quantizer is provided for quantizing an output from the integrator and providing a loop output signal. A gain circuit is coupled to the quantizer of the second quantization loop for amplifying the output of the second quantization loop by a second predetermined gain. An error correction circuit is coupled to the gain circuit for selectively varying the second predetermined gain in response to the output signal and for setting the second predetermined gain equal to a value which results in the second predetermined gain being substantially equal to a reciprocal of the first predetermined gain.

These and other objects, features and advantages will be more clearly understood from the following detailed description taken in conjunction with the accompanying drawings.

DETAILED DESCRIPTION OF THE INVENTION

Figure 1:
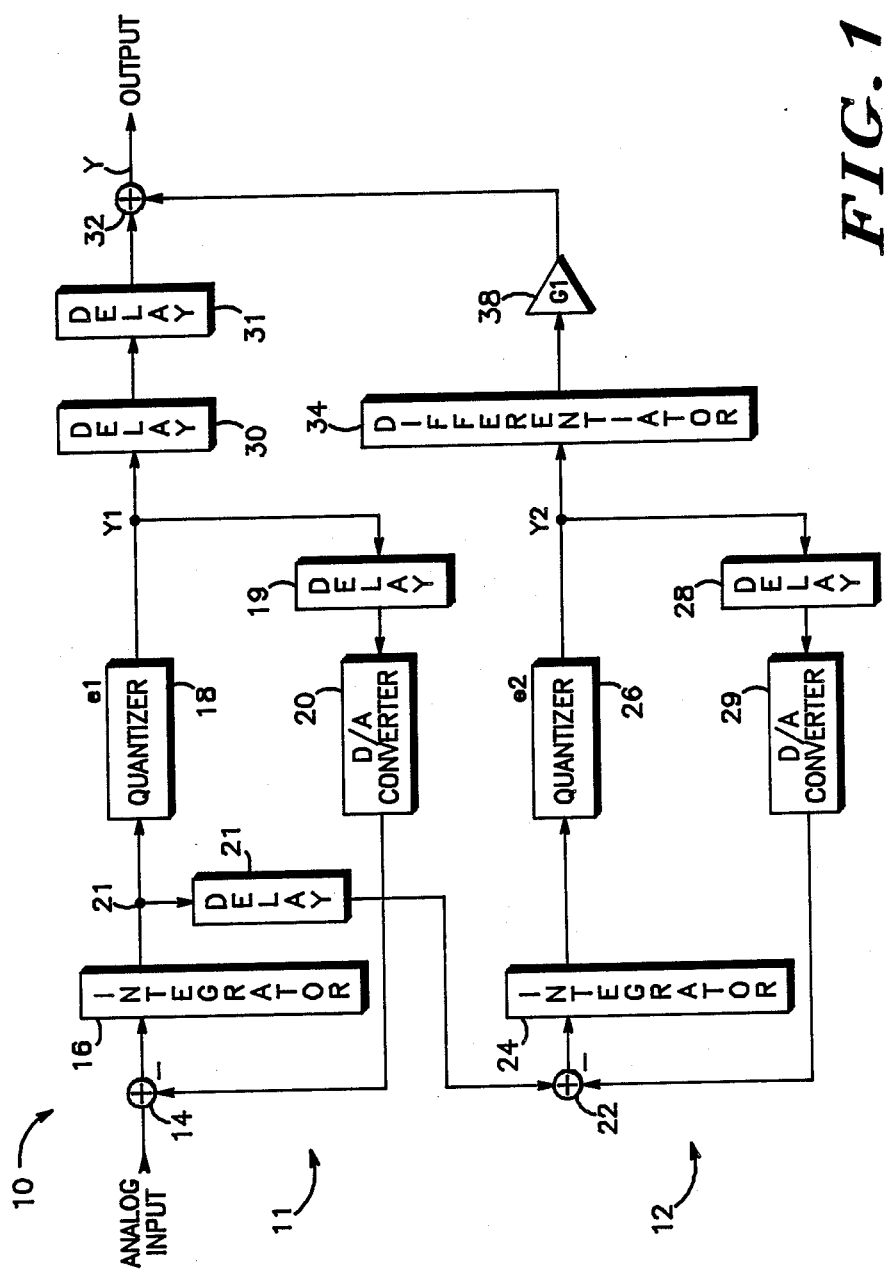
FIG. 1 illustrates in block diagram form an oversampled converter known in the art.

Shown in FIG. 1 is a known oversampling converter 10 generally having a first quantization loop 11 and a second quantization loop 12. Quantization loop 11 comprises an analog input terminal for receiving an analog input signal labeled "X". Signal X is connected to a first input of a subtractor circuit 14. An output of subtractor circuit 14 is connected to an input of an integrator circuit 16 having a gain labeled "K1". An output of integrator circuit 16 is connected to an input of a quantizer circuit 18. An output of quantizer circuit 18 provides a signal labeled "Y1" and is connected to an input of a delay circuit 19. Quantizer circuit 18 performs the conversion from analog to digital form and has a quantization error labeled "e1" associated therewith. An output of delay circuit 19 is connected to an input of a D/A converter 20. An output of D/A converter 20 is connected to a second input of subtractor circuit 14.

Quantization loop 12 comprises a subtractor circuit 22 having a first input connected to an output of a delay circuit 21. An input of delay circuit 21 is connected to the output of integrator circuit 16. An output of subtractor circuit 22 is connected to an input of an integrator circuit 24 having a gain labeled "K2". An output of integrator circuit 24 is connected to an input of a quantizer circuit 26. An output of quantizer circuit 26 provides a signal labeled "Y2" and is connected to an input of a delay circuit 28. Quantizer circuit 26 also performs a conversion from analog to digital form and has a quantization error labeled "e2" associated therewith An output of delay circuit 28 is connected to an input of a D/A converter 29. An output of D/A converter 29 is connected to a second input of subtractor circuit 22.

An output of quantizer circuit 18 is connected to an input of a delay circuit 30. An output of delay circuit 30 is connected to an input of a delay circuit 31. An output of delay circuit 31 is connected to a first input of an adder circuit 32. An output of quantizer circuit 26 is connected to an input of a digital differentiator circuit 34. An output of differentiator circuit 34 is connected to an input of a gain amplifier 38 having a gain "G1". An output of gain amplifier 38 is connected to a second input of adder circuit 32. An output of adder circuit 32 provides a digital output signal.

In operation, converter 10 functions as a sigma delta modulation data converter which is a technique which utilizes oversampling followed by a digital decimation process. Sigma delta modulation uses integration and feedback to move quantization noise out of a baseband frequency. Modulators which use double integration and two-level quantization as in converter 10 are easy to implement and sufficiently accurate for a broad range of applications. A brief mathematical analysis of converter 10 will further illustrate the principles of sigma delta modulation. Analog input signal X is coupled to subtractor circuit 14 where a feedback signal which may be represented as (X1-Y1D) is subtracted from signal X, where "Y1D" represents a delayed Y1 signal and "D" is the frequency domain equivalent of a delay element. The difference signal resulting therefrom is integrated by integrator 16 having a gain designated by K1. Quantizer 18 functions to transform the integrated analog signal into a digital equivalent signal Y1 but in doing so introduces a finite amount of error "e1". From a frequency standpoint, the signal Y1 may be represented as:

$$Y1 = [K1(X - Y1D)]/[(1-D)K1] + e1 \quad (1)$$

where $[K1/(1-D)]$ represents the integration of the signal $(X-Y1D)$ performed by integrator 16. Signal Y1 may be further simplified into:

$$Y1 = X + e1(1-D). \quad (2)$$

The signal Y2 may be represented as:

$$Y2 = K1(X - e1D)D + e2(1-D). \quad (3)$$

Signals Y1 and Y2 are combined to form the converted output signal. Referring to FIG. 1, it can be readily shown that the output signal Y may be represented as:

$$Y = Y1D^2 + Y2G1(1-D). \quad (4)$$

If the expressions for Y1 and Y2 in equations 2 and 3, respectively, are substituted into equation 4, signal Y may be further represented as:

$$Y = XD^2 + e1(1-D)D^2 + (X)(K1)(G1)(1-D)\cdot D - e1(K1)(G1)(1-D)D^2 + e2(G1)(1-D)^2. \quad (5)$$

Signal Y of equation 5 further simplifies to the following expression:

$$Y = X[K1G1 + (1-K1G1)D]\cdot D + e1(1-K1G1)(1-D)D^2 + e2(G1)(1-D)^2. \quad (6)$$

From equation 6, it should be noted that the quantization noise e1 from quantizer circuit 18 of quantization loop 11 may completely cancel if, and only if, gain G1 of amplifier 38 is exactly equal to the reciprocal of gain K1 of integrator 16. A problem inherent in this known converter is that integrator circuit 16 is an analog circuit whose gain K1 is subject to variation in even tightly controlled electronic processes. Amplifier 38 is a digital circuit having a fixed gain with the nominal value (1/K1). As a result, a limiting factor in the performance of the known oversampling converter is the variation in gain of the analog integrator circuit 16.

Figure 2:
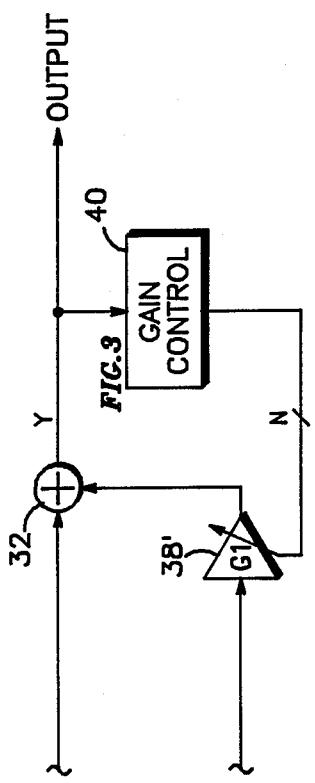
FIG. 2 illustrates in block diagram form the digital error correction circuit of the present invention.

Shown in FIG. 2 is a solution to the error which exists in converter 10 of FIG. 1 resulting from gain variation of integrator circuit 16. For convenience of illustration, converter 10 of FIG. 1 is not fully illustrated in FIG. 2 and it is assumed that the outputs of delay circuit 31 and differentiator 34 of FIG. 1 may be respectively connected to inputs of adder circuit 32 and a modified gain circuit 38' shown in FIG. 2. Instead of attempting to correct the gain variation of analog integrator circuit 16 of FIG. 1, the present invention utilizes a gain control circuit 40 which varies the digital gain G1 of amplifier circuit 38' which is similar to amplifier circuit 38 of FIG. 1. As shown in FIG. 2, converter 10 may be modified by connecting an input of gain control circuit 40 to the output of adder circuit 32 for receiving output signal Y. An output of gain control circuit 40 is connected to a control input of gain amplifier circuit 38. The output of gain control circuit 40 may be an N bit digital control signal as indicated in FIG. 2, where N is an integer.

Figure 3:
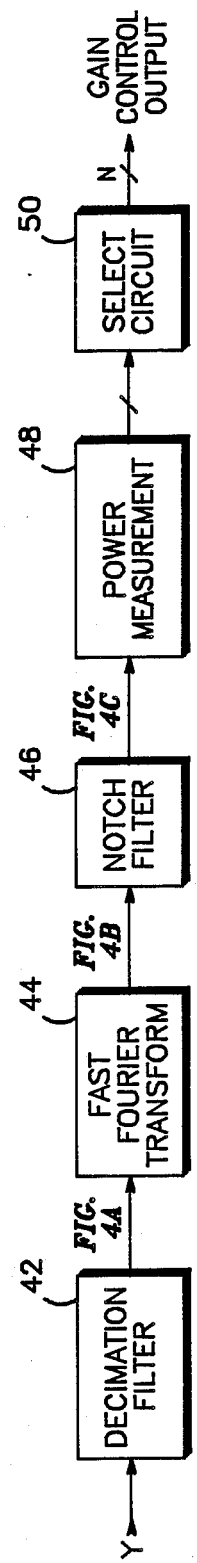
FIG. 3 illustrates in block diagram form a detailed portion of the error correction circuit shown in FIG. 2.

Shown in FIG. 3 is a detailed illustration of gain control circuit 40 of FIG. 2. Gain control circuit 40 comprises a decimation filter 42 having an input for receiving output signal Y. An output of decimation filter 42 is connected to an input of a fast Fourier transform (FFT) circuit 44. An output of fast Fourier transform circuit 44 is connected to an input of a notch filter circuit 46. An output of notch filter 46 is connected to an input of a power measurement circuit 48. An output of power measurement circuit 48 is connected to an input of a select logic circuit 50. The output of power measurement circuit 48 may be a multi-bit bus structure for outputting a plurality of output signals as indicated in FIG. 3. However, a single bit output bus which is time multiplexed to output a plurality of output signals may also be implemented. An output of select logic circuit 50 is coupled to amplifier circuit 38' for variably adjusting the gain of amplifier circuit 38' in response to the output signal Y.

In a preferred form, decimation filter 42 of FIG. 3 may be implemented with a filter structure as disclosed in our copending U.S. patent application, Ser. No. 07/147,958, entitled "A Multiple Output Oversampling A/D Converter With Each Output Containing Data and Noise". Fast Fourier Transform circuit 44 may be implemented either in hardware or by software as a design choice. A detailed discussion of the FFT algorithm and hardware implementations of the FFT may be found in *Theory and Application of Digital Signal Processing* by Lawrence R. Rabiner and Bernard Gold, Prentice-Hall, Inc., 1975 at chapters 6 and 10. Notch filter 46 may be implemented with any of several well known notch filter structures. Power measurement circuit 48 functions to provide a value of the signal power level of the output of notch filter 46. By taking a summation of N samples of input values which are squared and dividing the resultant sum by N, the RMS power of the output of notch filter 46 may be calculated, where N is an integer value. Select logic circuit 50 is a conventional logic circuit which functions to receive a plurality of digital input signals from power measurement circuit 48 and outputs the signal of largest magnitude.

Figure 4A:
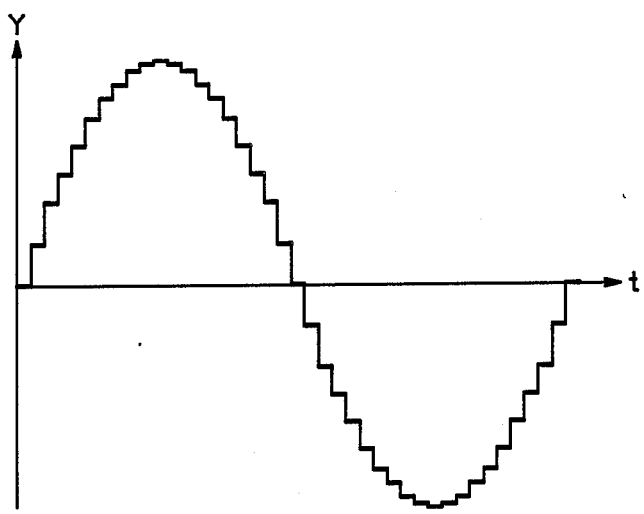
FIG. 4a–4c illustrate output waveforms at different nodes in FIG. 3.
Figure 4B:
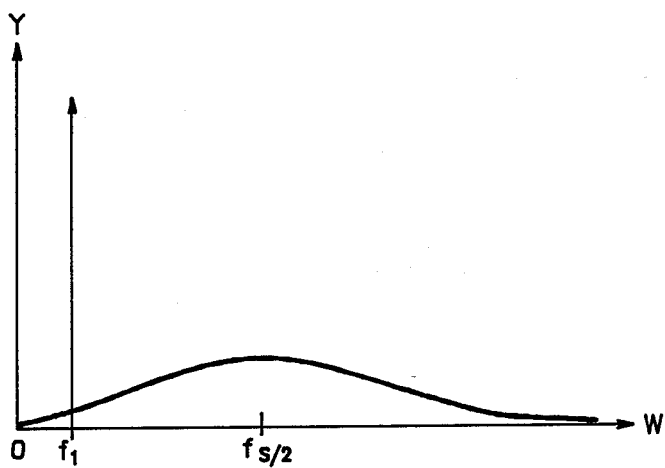
Figure 4C:
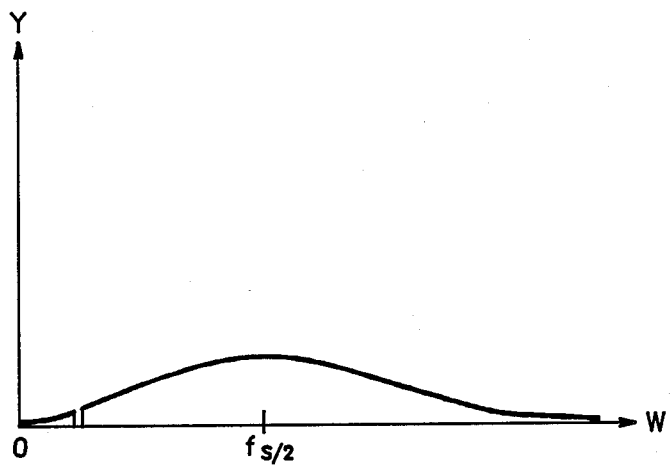

In one form, gain control circuit 40 functions during a calibration period of converter 10 to vary the gain of digital amplifier circuit 38' a predetermined number of times which results in the output signal Y having a predetermined number of different values. During the calibration phase, the analog input signal X is connected to a sinusoidal input signal having a predetermined average D.C. level such as analog ground. The use of of a signal having an average D.C. level results in the term "X" in equation 5 having an average value of zero. By referring to equation 6, it can be seen that in the calibration mode, when gain G1 equals (1/K1), the noise in the output signal Y has a minimum value. Therefore, during the calibration period, gain control circuit 40 varies the gain of digital amplifier circuit 38' a predetermined number of times. Decimation filter 42 functions to decimate or reduce the oversampling frequency at which converter 10 is operating down to a substantially lower frequency, $F_S$. Shown in FIG. 4A is an illustration of the output waveform of decimation filter 42. The output of decimation filter is a digitized sinusoidal signal. The fast Fourier transform of the decimated conversion signal transforms the signal to provide a determination of the power spectrum of the output signal of adder 32. It should be noted that circuit 44 may be implemented by any software or hardware mechanism which implements a discrete Fourier transform such as an FFT. Shown in FIG. 4B is an illustration of the output of fast Fourier transform circuit 44. The output of circuit 44 contains a data component at frequency $f_1$ and a noise component over the entire spectrum which increases in frequency up to a frequency of one-half the sampling frequency ($f_s/2$). As frequency increases, the noise component of the signal becomes level. Notch filter 46 may then be used to remove a predetermined portion of the frequency spectrum containing data and noise. Shown in FIG. 4C is an illustration of the output of notch filter 46. The output of notch filter 46 contains only noise. The predetermined range of noise components are then coupled to power measurement circuit 48 which calculates the power of the signal represented by the cross hatching. The output signal power is measured for each gain setting. The output signal which contains the smallest amount of noise represents the gain setting which most closely approximates 1/K1) and should be the gain selected by select circuit 50 to utilize for amplifier circuit 36 during a valid operation period. Therefore, power measurement circuit 48 is a conventional circuit which functions to measure the power content of each output signal of adder 32 resulting from a predetermined gain setting of amplifier circuit 38'. When the calibration period is over, the reference potential is removed from the input of adder circuit 14 and a valid analog input signal X may be applied to converter 10 for accurate conversion. Depending upon an application, converter 10 may be placed in the calibration time period or phase only once at the beginning of conversion operation or may periodically default into a calibration mode of operation.

In the illustrated form, amplifier circuit 38' may be implemented as a conventional digital multiplier which multiplies the gain provided by select circuit 50 with the digital output of differentiator 34. Should additional quantization loops be added, gain control circuit 40 may also be utilized to calibrate the gains of subsequent analog integrators and digital gain circuits without adding additional control circuitry. The present invention may also be used with other implementations of oversampling converters such as the converter taught in our copending U.S. patent application Ser. No. 07/147,958 filed Jan. 25, 1988, wherein a single output signal does not exist. In oversampling converters as taught in the above mentioned application, decimation filter 42 of gain control circuit 40 may be readily adapted to receive multiple output signals from an oversampling converter. Regardless of the exact form of the oversampling converter, the digital gain setting which results in the lowest amount of power during a test of various digital gain settings in the calibration mode represents the digital gain which results in the product of the analog gain of an integrator and the gain of a digital gain circuit most closely equaling one.

By now it should be apparent that the present invention functions to provide digital error correction in an oversampling A/D converter. The present invention provides error correction resulting from errors primarily due to analog circuit parameter variations. Rather than approaching the error problem by trying to correct the analog errors with correction to the analog circuitry directly, the present invention varies the digital circuitry in a precise manner to compensate for the analog variation. The present invention therefore provides a much higher signal to noise ratio in an oversampled A/D converter. Although the present invention has been discussed in the context of gain control circuit 40 being incorporated on board in an integrated circuit containing converter 10, it should be readily understood that the present invention may be utilized off chip from an integrated said circuit containing converter 10. In another form, the present invention may be implemented with a gain control circuit which does not require a dedicated calibration time period and is an active circuit. In the active form, gain control circuit 40 functions to constantly adjust the gain of digital gain circuit 38' in response to the output signal and compensates for variations in the gain of analog integrator 16 to minimize output signal errors resulting from the gain variations.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. An oversampled A/D converter having digital error correction for converting an analog input signal to a digital output signal, said converter having a plurality of quantization loops, each of the loops comprising:
   an integrator for integrating a difference between an input terminal signal and a feedback signal, an integrator of a first quantization loop having a first predetermined gain; and
   a quantizer for quantizing an output from the integrator and providing a loop output signal;
said converter further comprising:
   gain means coupled to a quantizer of a second quantization loop for amplifying the output of the second quantization loop by a second predetermined gain;
   means for combining the loop output signals of the plurality of quantization loops to form the digital output signal; and
   control means coupled to gain means for selectively varying the second predetermined gain in response to the output signal, said control means setting the second predetermined gain equal to a value which results in the first predetermined gain being substantially equal to a reciprocal of the second predetermined gain.

2. The oversampled A/D converter of claim 1 wherein said control means further comprise:
   first filter means having an input coupled to the output signal and an output, said filter means filtering the output signal by decimating the output signal from an oversampled frequency to a substantially lower frequency;

means for implementing a discrete Fourier transform (DFT) of the output of the first filter means and providing a transformed signal;

second filter means having an input coupled to the transformed signal, said second filter means filtering a predetermined frequency range from the transformed signal to provide a transformed filtered signal;

power measurement means having an input for receiving the transformed filtered signal and an output for providing a plurality of power signals, each power signal indicating an amount of noise in the output signal; and logic means having an input coupled to the output of the power measurement means, and an output for providing a predetermined one of the power signals to the gain means to set the second predetermined gain.

3. In an oversampling converter for converting an analog input signal to a digital output signal and having a sampling frequency sufficiently higher than an input signal frequency and using a plurality of quantization loops, each of the loops comprising:

an integrator for integrating a difference between an input terminal signal and a feedback signal, an integrator of a first quantization loop having a first predetermined gain; and a quantizer for quantizing an output from the integrator and providing a loop output signal;

a method for digitally correcting error associated with the integrator of at least a first of the loops, comprising the steps of:

coupling gain means to an quantizer of a second quantization loop for amplifying the output of the second quantization loop by a second predetermined gain;

providing means for combining the loop output signal of each quantization loop to form the digital output signal; and coupling control means to the gain means for selectively varying the second predetermined gain in response to the output signal, the control means setting the second predetermined gain equal to a value which results in the first predetermined gain being substantially equal to a reciprocal of the second predetermined gain.

4. In an oversampled A/D converter having a sampling frequency greater than an input signal frequency, said converter having at least first and second quantization loops for respectively producing first and second digital loop output signals, each quantization loop comprising an integrator for integrating a difference between an input terminal and a feedback signal coupled from the digital loop output signal, and a quantizer for quantizing an output from the integrator to provide the digital loop output signal, said first quantization loop having a first gain and an analog error associated therewith, a method for providing error correction in the oversampled converter, comprising the steps of:

amplifying the second digital loop output signal by a second gain which is substantially a reciprocal of the first gain;

combining the first and second digital loop output signals to provide a digital converter output signal; and varying the second gain in response to the digital converter output signal to correct converter error resulting from variation in the first gain.

5. The method of claim 4 wherein the first and second loop output signals are combined by a digital adder circuit.

6. The method of claim 4 wherein said second gain is varied to maintain a product of the first gain and a reciprocal of the second gain substantially equal to one.

7. The method of claim 4 further comprising the step of:

selecting a value for the second gain in order to maintain a product of the first gain and a reciprocal of the second gain substantially equal to one, said second gain value selected by measuring noise in the output signal resulting from a plurality of varying second gain settings to select an optimum value for the second gain.

* * * * *